US012727422B2

(12) United States Patent
Sugita

(10) Patent No.: US 12,727,422 B2
(45) Date of Patent: Sep. 1, 2026

(54) WAFER CLEANING WATER SUPPLY SYSTEM AND WAFER CLEANING WATER SUPPLY METHOD

(71) Applicant: KURITA WATER INDUSTRIES LTD., Tokyo (JP)

(72) Inventor: Wataru Sugita, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 665 days.

(21) Appl. No.: 18/026,600

(22) PCT Filed: Sep. 22, 2021

(86) PCT No.: PCT/JP2021/034813
§ 371 (c)(1),
(2) Date: Mar. 16, 2023

(87) PCT Pub. No.: WO2022/091654
PCT Pub. Date: May 5, 2022

(65) Prior Publication Data

US 2023/0335417 A1 Oct. 19, 2023

(30) Foreign Application Priority Data

Oct. 27, 2020 (JP) ................................ 2020-180004

(51) Int. Cl.
*H10P 72/00* (2026.01)
*C02F 1/00* (2023.01)
(Continued)

(52) U.S. Cl.
CPC .......... *H10P 72/0414* (2026.01); *C02F 1/006* (2013.01); *C02F 1/008* (2013.01);
(Continued)

(58) Field of Classification Search
None
See application file for complete search history.

(56) References Cited

U.S. PATENT DOCUMENTS

2013/0068324 A1 3/2013 Furusho et al.
2015/0328668 A1 11/2015 Koyama et al.
(Continued)

FOREIGN PATENT DOCUMENTS

JP 2011238666 A 11/2011
JP 2015073009 A 4/2015
(Continued)

OTHER PUBLICATIONS

International Search Report issued Dec. 7, 2021 in PCT/JP2021/034813 (with English translation), 4 pages.
(Continued)

*Primary Examiner* — Richard C Gurtowski
(74) *Attorney, Agent, or Firm* — Element IP, PLC

(57) ABSTRACT

The wafer cleaning water supply system of the present invention has a wafer cleaning water production unit producing wafer cleaning water having a chemical agent, a replenishment pipe extending from the wafer cleaning water production unit, and a circulation-type cleaning water supply pipe connected to the replenishment pipe. The circulation-type cleaning water supply pipe feeds a liquid to a use point via a feeding pump and is provided with a supply-side flowmeter and a recovery-side flowmeter. The measurement results of the supply-side and recovery-side flowmeters and the water quality data obtained by a monitor of a sampling pipe for monitoring are transmitted to a control device, which controls the wafer cleaning water production unit. With such a configuration, the wafer cleaning water supply
(Continued)

system involves a small amount of excess water, dissolved gas is less likely to be mixed with the wafer cleaning water, and space-saving is possible.

9 Claims, 4 Drawing Sheets

(51) Int. Cl.

| | |
|---|---|
| ***C02F 1/66*** | (2023.01) |
| ***C02F 1/68*** | (2023.01) |
| *B08B 3/08* | (2006.01) |
| *B08B 13/00* | (2006.01) |
| *C02F 103/04* | (2006.01) |

(52) U.S. Cl.

CPC .................. *C02F 1/66* (2013.01); *C02F 1/68* (2013.01); *H10P 72/0604* (2026.01); *B08B 3/08* (2013.01); *B08B 13/00* (2013.01); *C02F 2103/04* (2013.01); *C02F 2201/005* (2013.01); *C02F 2209/03* (2013.01); *C02F 2209/40* (2013.01)

(56) References Cited

U.S. PATENT DOCUMENTS

| | | | | |
|---|---|---|---|---|
| 2017/0029306 | A1* | 2/2017 | Ukai .................... | B01D 61/147 |
| 2020/0152488 | A1 | 5/2020 | Morita et al. | |

FOREIGN PATENT DOCUMENTS

| | | | |
|---|---|---|---|
| JP | 2015220318 | A | 12/2015 |
| JP | 2018157149 | A | 10/2018 |
| JP | 2018182099 | A | 11/2018 |
| JP | 2019192863 | A | 10/2019 |
| WO | WO-2020039764 | A1 | 2/2020 |

OTHER PUBLICATIONS

Office Action issued Dec. 7, 2021 in Japanese Patent Application No. 2020-180004 (with English translation), 11 pages.

* cited by examiner

WAFER CLEANING WATER SUPPLY SYSTEM AND WAFER CLEANING WATER SUPPLY METHOD

TECHNICAL FIELD

The present invention relates to a wafer cleaning water supply system and a method of supplying wafer cleaning water that are able to stably supply cleaning water that contains very low concentrations of solutes such as alkali, acid, oxidant, reductant, various gas components and that is effective in a step of cleaning/rinsing wafers for semiconductors.

BACKGROUND ART

The step of cleaning silicon wafers for semiconductors, etc. may include using water in which solutes effective for controlling the pH and the redox potential are dissolved in ultrapure water at very low concentrations (such water will be referred to as wafer cleaning water). This wafer cleaning water uses ultrapure water as the basic material, to which a minimum amount of acid/alkali and/or oxidant/reductant is added in order to allow the wafer cleaning water to have liquid properties such as the pH and the redox potential that match the purpose of each step such as a cleaning step or a rinsing step. In this operation, $H_2$ gas-dissolved water is used to give the reducing properties, but for adjusting the pH and giving the oxidizing properties, a method of adding a small amount of liquid chemical agents (chemical feeding) is generally used in such a manner that the chemical solution is injected with a pump or in a pressurization scheme with inert gas.

In this case, if the flow volume of ultrapure water is constant, it is easy to perform the chemical feeding such that a desired solute concentration is obtained, but in a cleaning machine in which the wafer cleaning water is actually used, the supply/stop of the cleaning water poured onto the wafer is controlled by opening and closing a plurality of valves, and the flow volume fluctuates irregularly. In response to this fluctuation, dissolution control is performed by various schemes such as proportional control for the ultrapure water flow volume and PID control with a received signal from a concentration monitor so that the solute concentration of the wafer cleaning water falls within a desired range. Unfortunately, however, the chemical feeding control that can sufficiently follow the irregular flow volume fluctuation has not been realized particularly in a single-wafer type cleaning machine having a plurality of cleaning chambers. As a countermeasure, it is conceivable to produce the wafer cleaning water on the assumption of the maximum usage amount and supply it to the cleaning machine, but this would result in supplying a significantly excessive amount of the wafer cleaning water, and the expensive wafer cleaning water may be wasted.

In this context, for the purpose of saving the wafer cleaning water, Patent Document 1 proposes a wafer cleaning water supply system adopting a scheme in which a reservoir is provided and the wafer cleaning water that is not used in the cleaning machine is returned to the reservoir and circulated.

PRIOR ART DOCUMENT

Patent Document

[Patent Document 1] JP2018-182099A

SUMMARY OF THE INVENTION

Problems to be Solved by the Invention

However, the wafer cleaning water supply system described in Patent Document 1 uses a reservoir, so not only the size of the device inevitably increases, but also the contact time between the produced wafer cleaning water and a gas and the residence time after producing the wafer cleaning water become long. Thus, there is a problem in that the concentration of dissolved gas in the wafer cleaning water is likely to increase. To overcome such a problem, the reservoir may be purged with $N_2$ gas, but in this case, not only the problem of an increased size of the device becomes more apparent, but also another problem of dissolution of the $N_2$ gas may arise.

Thus, there has not been a wafer cleaning water supply system that can control the solute concentration of the wafer cleaning water and involves a small amount of excess water and with which dissolved gas is less likely to be mixed with the wafer cleaning water and space-saving is possible.

The present invention has been made in view of the above problems, and an object of the present invention is to provide a wafer cleaning water supply system that involves a small amount of excess water and with which dissolved gas is less likely to be mixed with the wafer cleaning water and space-saving is possible.

Means for Solving the Problems

In view of the above object, first, the present invention provides a wafer cleaning water supply system comprising: a wafer cleaning water production unit that dissolves a chemical agent in ultrapure water thereby to produce wafer cleaning water having a predetermined concentration of the chemical agent; a circulation-type cleaning water supply pipe that supplies the wafer cleaning water produced by the wafer cleaning water production unit to a use point; a replenishment pipe that connects the wafer cleaning water production unit and the circulation-type cleaning water supply pipe; a measurement means for calculating a usage amount of cleaning water at the use point of the wafer cleaning water that circulates through the circulation-type cleaning water supply pipe; and a control means that controls a replenishment amount of the wafer cleaning water from the wafer cleaning water production unit to the circulation-type cleaning water supply pipe based on a measurement result of the measurement means (Invention 1).

According to the invention (Invention 1), the usage amount of the wafer cleaning water is calculated by measuring the recovery amount of the wafer cleaning water circulating through the circulation-type cleaning water supply pipe, and when the amount of the wafer cleaning water circulating through the circulation-type cleaning water supply pipe falls below a predetermined amount, the corresponding amount of the wafer cleaning water is produced and replenished by the wafer cleaning water production unit, so that it is sufficient that only the required amount of the wafer cleaning water may be produced; therefore, excess water can be minimized. Moreover, the chemical agent component of the wafer cleaning water can be controlled with a high degree of accuracy. In the present invention, it is assumed that the predetermined amount refers to an amount that falls within a certain quantitative range with respect to a reference amount, and the predetermined concentration of the chemical agent refers to a concentration that falls within a certain concentration range with respect to a reference concentration.

In the above invention (Invention 1), the measurement means may be a flowmeter, the usage amount of the wafer cleaning water at the use point may be calculated based on a measurement value of the flowmeter, and the replenishment amount of the wafer cleaning water may be controlled by the control means (Invention 2).

According to the invention (Invention 2), the usage amount of the wafer cleaning water is calculated by providing the circulation-type cleaning water supply pipe with the flowmeter as the measurement means that measures the recovery amount, and an amount of the wafer cleaning water corresponding to the usage amount is produced and replenished by the wafer cleaning water production unit, so that it is sufficient that only the required amount of the wafer cleaning water may be produced; therefore, excess water can be minimized. Moreover, the chemical agent component of the wafer cleaning water can be controlled with a high degree of accuracy.

In the above invention (Invention 1), the measurement means may be a pressure gauge, the usage amount of the wafer cleaning water from the use point may be calculated based on a measurement value of the pressure gauge, and the replenishment amount of the wafer cleaning water may be controlled by the control means (Invention 3).

According to the invention (Invention 3), the pressure of the recovered water returning through the circulation-type cleaning water supply pipe is measured by providing the circulation-type cleaning water supply pipe with the pressure gauge as the measurement means that measures the recovery amount, the recovery amount of the wafer cleaning water corresponding to the pressure is calculated, and when the recovery amount falls below a predetermined amount, a determination is made that the wafer cleaning water runs short, and an amount of the wafer cleaning water corresponding to the usage amount of the wafer cleaning water (supply amount minus recovery amount) is produced and replenished by the wafer cleaning water production unit, so that it is sufficient that only the required amount of the wafer cleaning water may be produced; therefore, excess water can be minimized. Moreover, the chemical agent component of the wafer cleaning water can be controlled with a high degree of accuracy.

In the above invention (Invention 1 to 3), the use point may preferably have a plurality of cleaning machines (Invention 4).

When the use point has a plurality of cleaning machines, the usage amount of the wafer cleaning water at the use point as a whole fluctuates greatly depending on the operation situation of each cleaning machine.

According to the invention (Invention 4), when an amount of the wafer cleaning water used depending on the fluctuation is produced and replenished by the wafer cleaning water production unit, it is sufficient that only the required amount of the wafer cleaning water may be produced;

therefore, excess water can be minimized. Moreover, the chemical agent component of the wafer cleaning water can be controlled with a high degree of accuracy.

In the above invention (Invention 1 to 4), the circulation-type cleaning water supply pipe may preferably have a relief valve (Invention 5).

According to the invention (Invention 5), when an excessive amount of the wafer cleaning water circulates through the circulation-type cleaning water supply pipe, by discharging the wafer cleaning water from the relief valve, it is possible to properly maintain the amount of the wafer cleaning water circulating through the circulation-type cleaning water supply pipe.

In the above invention (Invention 1 to 5), preferably, no reservoir may be provided between the wafer cleaning water production unit and the circulation-type cleaning water supply pipe (Invention 6).

According to the invention (Invention 6), since the wafer cleaning water is directly supplied from the wafer cleaning water production unit to the circulation-type cleaning water supply pipe through the replenishment pipe, thereby eliminating the need to provide a reservoir, the wafer cleaning water supply system can be made compact, and the wafer cleaning water does not stay in a reservoir; therefore, the residence time from the production to the use of the wafer cleaning water can be shortened, and the cleanliness can thus be ensured.

In the above invention (Invention 1 to 6), the wafer cleaning water production unit may be preferably supplied with a liquid chemical agent component by a pump or by a pressurization means using an inert gas to supply the liquid chemical agent component from a tank that stores the liquid chemical agent component (Invention 7).

According to the invention (Invention 7), it is possible to stably adjust the amount of the wafer cleaning water supplied from the wafer cleaning water production unit to the circulation-type cleaning water supply pipe.

Second, the present invention provides a method of supplying wafer cleaning water, comprising: dissolving a chemical agent in ultrapure water thereby to produce wafer cleaning water having a predetermined concentration of the chemical agent; feeding the produced wafer cleaning water to a circulation-type cleaning water supply pipe thereby to supply the wafer cleaning water to a use point; and circulating, by the circulation-type cleaning water supply pipe, the wafer cleaning water unused at the use point and reusing the unused wafer cleaning water, the method further comprising: measuring an index for calculating a usage amount of cleaning water at the use point of the wafer cleaning water that circulates through the circulation-type cleaning water supply pipe; and controlling, by a control means, a replenishment amount of the wafer cleaning water based on the measurement result (Invention 8).

According to the invention (Invention 8), by controlling the replenishment amount of the wafer cleaning water corresponding to the usage amount of cleaning water at the use point of the wafer cleaning water that circulates through the circulation-type cleaning water supply pipe, it is sufficient that only the required amount of the wafer cleaning water may be replenished, and excess water can therefore be minimized. Moreover, the chemical agent component of the wafer cleaning water can be controlled with a high degree of accuracy.

In the above invention (Invention 8), the wafer cleaning water may be preferably not supplied to the circulation-type cleaning water supply pipe until a chemical agent component of the wafer cleaning water reaches a predetermined concentration (Invention 9).

According to the invention (Invention 9), it is possible to prevent the wafer cleaning water, which does not satisfy the predetermined chemical agent component concentration, from being supplied to the use point.

In the above invention (Invention 8, 9), a small amount of cleaning water may be preferably supplied to the circulation-type cleaning water supply pipe even when the wafer cleaning water is not used at the use point (Invention 10).

According to the invention (Invention 10), the production of the wafer cleaning water having the predetermined chemical agent concentration is not stopped, and the chemical agent concentration of the wafer cleaning water can therefore be stabilized.

Advantageous Effect of the Invention

According to the wafer cleaning water supply system of the present invention, the usage amount at the use point of the wafer cleaning water circulating through the circulation-type cleaning water supply pipe is calculated, and an amount of the wafer cleaning water corresponding to the usage amount is produced and replenished by the wafer cleaning water production unit, so that it is sufficient that only the required amount of the wafer cleaning water may be produced; therefore, excess water can be minimized. Moreover, the chemical agent component of the wafer cleaning water can be controlled with a high degree of accuracy. Furthermore, since there is no need to provide a reservoir, not only the entire system can be made compact, but also the wafer cleaning water does not stay in a reservoir; therefore, the residence time from the production to the use of the wafer cleaning water can be shortened, and the cleanliness can thus be ensured.

EMBODIMENTS FOR CARRYING OUT THE INVENTION

First Embodiment

Hereinafter, the first embodiment of the wafer cleaning water supply system and method of supplying wafer cleaning water of the present invention will be described in detail with reference to the accompanying drawing.

<Wafer Cleaning Water Supply System>

Figure 1:
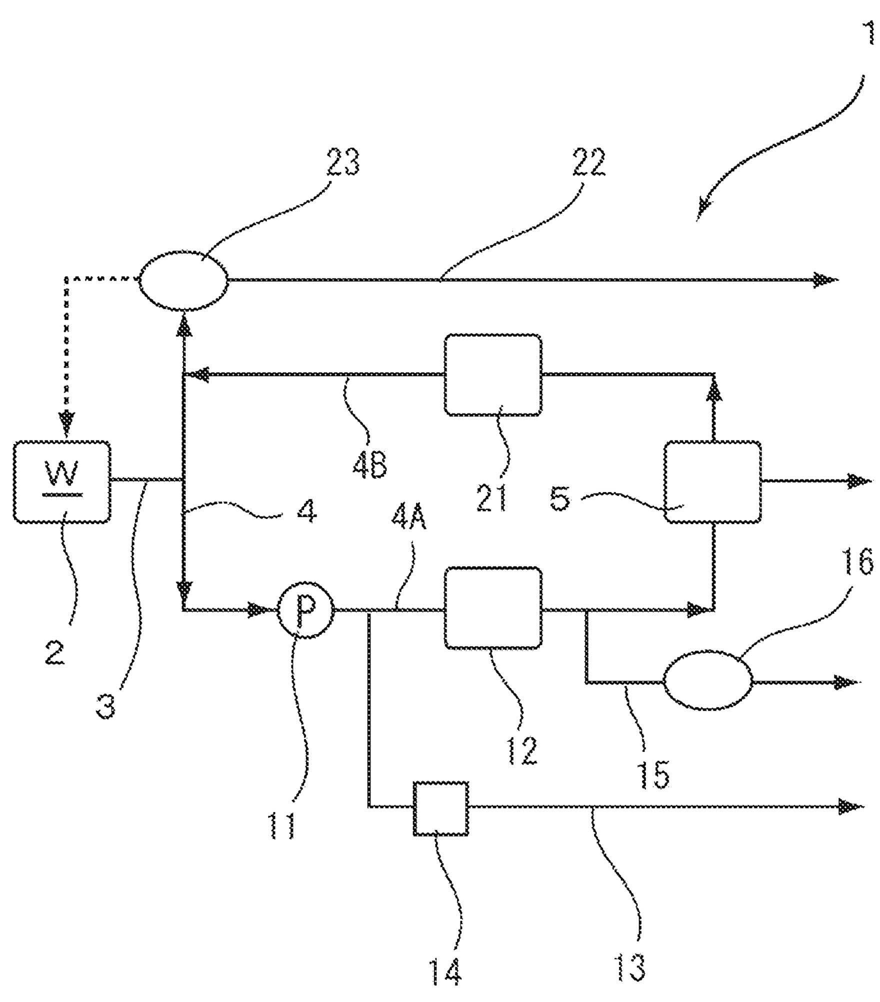
FIG. 1 is a schematic diagram illustrating a wafer cleaning water supply system according to a first embodiment of the present invention.

FIG. 1 illustrates a wafer cleaning water supply system according to the first embodiment of the present invention. In FIG. 1, a wafer cleaning water supply system 1 has a wafer cleaning water production unit 2 that dissolves a predetermined amount of a chemical agent in a flow volume of ultrapure water thereby to produce wafer cleaning water having a predetermined concentration of the chemical agent, a replenishment pipe 3 that extends from the wafer cleaning water production unit 2, and a circulation-type cleaning water supply pipe 4 that is connected to the replenishment pipe 3.

The circulation-type cleaning water supply pipe 4 can feed a cleaning liquid W to a use point 5 via a feeding pump 11. In the present embodiment, two flow paths between the connection portion of the cleaning water supply pipe 4 to the replenishment pipe 3 and the use point 5 will be referred to as a supply side 4A and a recovery side 4B. The supply side 4A is provided with a supply-side flowmeter 12 as the measurement means, and a discharge pipe 13 and a sampling pipe for analysis 15 are connected to the supply side 4A. The discharge pipe 13 is provided with a relief valve (pressure regulating valve) 14. The sampling pipe for analysis 15 is provided with a first monitor 16 that cooperates with various water quality sensors (not illustrated). The recovery side 4B is provided with a recovery-side flowmeter 21 as the measurement means, and a sampling pipe for monitoring 22 is connected to the recovery side 4B. The sampling pipe for monitoring 22 is provided with a second monitor 23 that cooperates with various water quality sensors (not illustrated). The measurement results of the supply-side flowmeter 12 and the recovery-side flowmeter 21 and the water quality data obtained by the first monitor 16 and the second monitor 23 with their various water quality sensors are transmitted to a control device (not illustrated), which can control the wafer cleaning water production unit 2.

<Method of Supplying Wafer Cleaning Water>

The description will now be directed to a method of supplying wafer cleaning water using the wafer cleaning water supply system 1 of the present embodiment having the configuration as described previously.

(Wafer Cleaning Water Production Step)

First, wafer cleaning water W is prepared through supplying ultrapure water to the wafer cleaning water production unit 2 and supplying a chemical solution so that it has a predetermined concentration with respect to the supply amount of the ultrapure water.

In the present specification, preferred properties of the ultrapure water as the raw water may be, for example, resistivity: 18.1 MΩ·cm or more, fine particles: 1000 particles/L or less with a particle diameter of 50 nm or more, viable bacteria: 1 bacterium/L or less, TOC (Total Organic Carbon): 1 μg/L or less, total silicon: 0.1 μg/L or less, metals: 1 ng/L or less, ions: 10 ng/L or less, hydrogen peroxide; 30 μg/L or less, and water temperature: 25±2° C.

As the chemical agent to be dissolved in the ultrapure water, for example, a pH adjuster can be used. The pH adjuster is not particularly limited, but when adjusting the pH to lower than 7, an acidic solution such as hydrochloric acid, nitric acid, sulfuric acid, or acetic acid can be used. When adjusting the pH to 7 or higher, an alkaline solution such as ammonia, sodium hydroxide, potassium hydroxide, or TMAH can be used. A gas-dissolving membrane may be further used to dissolve carbon dioxide gas ($CO_2$) in ultrapure water to a predetermined concentration.

Additionally or alternatively, a redox potential adjuster can be used as the chemical agent. When adjusting the redox potential to a high level (positive side), hydrogen peroxide solution or the like can be used as the redox potential adjuster. When adjusting the redox potential to a low level (negative side), a solution of oxalic acid, hydrogen sulfide, potassium iodide, or the like can be used. A gas-dissolving membrane may be further used to dissolve hydrogen ($H_2$), ozone ($O_3$), etc.

Either one of the pH adjuster and the redox potential adjuster may be added or both may also be added.

Immediately after the production of the wafer cleaning water W is started (i.e., in the initial stage), the concentration of the chemical agent in the wafer cleaning water W may not fall within a desired concentration range. Accordingly, the solute concentration of the wafer cleaning water W to be supplied from the replenishment pipe 3 can be controlled with a high degree of accuracy through preliminarily determining the time or processing amount required for the concentration to stabilize at a desired level and discharging the wafer cleaning water W as drain water until reaching the determined time or processing amount.

(Wafer Cleaning Water Supply Step)

The wafer cleaning water W produced by the wafer cleaning water production unit 2 flows into the circulation-type cleaning water supply pipe 4 via the supply pipe 3 and is supplied to the use point 5 by the feeding pump 11. At this time, the amount of the wafer cleaning water W supplied to the use point 5 is measured by the supply-side flowmeter 12, but when the use point 5 is composed of a plurality of cleaning machines, for example, the initial supply amount of the wafer cleaning water W may be set with reference to the maximum water amount so that the wafer cleaning water W will not run short at the use point 5. The water quality of the wafer cleaning water W is monitored by the first monitor 16 which cooperates with various water quality sensors (not illustrated) provided in the sampling pipe for analysis 15, and the monitoring is thus performed to achieve the set water quality.

Here, the usage amount of the wafer cleaning water W at the use point 5 fluctuates greatly depending on the number of cleaning machines in operation or the like. The unused wafer cleaning water W therefore flows back from the recovery side 4B of the circulation-type cleaning water supply pipe 4 toward the supply pipe 3. At this time, the amount of the recovered wafer cleaning water W is measured by the recovery-side flowmeter 21. The water quality of the wafer cleaning water W on the recovery side is monitored by the second monitor 23 which cooperates with various water quality sensors (not illustrated) provided in the sampling pipe for monitoring 22, and the monitoring is thus performed on a difference from the set water quality.

Then, the measurement value of the supply-side flowmeter 12 and the measurement value of the recovery-side flowmeter 21 are transmitted to the control device, which calculates the difference between both the measurement values as the amount of water used and controls the wafer cleaning water production unit 2 by feedback control to replenish the calculated amount of the wafer cleaning water W to the cleaning water supply pipe 4. In the present embodiment, when the amount of the wafer cleaning water W to be replenished becomes excessive and the pressure of the wafer cleaning water W in the cleaning water supply pipe 4 exceeds a predetermined value, the relief valve (pressure regulating valve) 14 is operated to discharge the excessive wafer cleaning water W from the discharge pipe 13, and the pressure of the wafer cleaning water W in the cleaning water supply pipe 4 can thereby be kept below a certain value. Furthermore, even when the wafer cleaning water W is not used at the use point 5, it is preferred to supply a small amount of the wafer cleaning water from the wafer cleaning water production unit 2 to the circulation-type cleaning water supply pipe so as not to stop the production of the wafer cleaning water W, thereby stabilizing the chemical agent concentration of the wafer cleaning water W. It is also preferred to transmit the measurement values of the first monitor 16 and the second monitor 23 measured by various water quality sensors to the control device and control, by the control device, the water quality of the wafer cleaning water W produced as necessary by the wafer cleaning water production unit 2 based on the measurement value of the water quality of the recovered wafer cleaning water W.

Thus, in the present embodiment, by measuring the recovery amount of the wafer cleaning water W circulating through the circulation-type cleaning water supply pipe 4, the recovery flow volume of the wafer cleaning water W circulating through the circulation-type cleaning water supply pipe 4 is measured to calculate the amount of water used at the use point 5 (amount of supplied water minus amount of recovered water) from the recovery flow volume of the wafer cleaning water W. Then, the wafer cleaning water production unit 2 produces and replenishes the wafer cleaning water W corresponding to that amount of water used, thereby minimizing the excessive wafer cleaning water W, and the chemical agent component of the wafer cleaning water W can be controlled with a high degree of accuracy. Moreover, an effect can be obtained that since there is no need to provide a reservoir, not only the entire system 1 can be made compact, but also the wafer cleaning water W does not stay in a reservoir; therefore, the residence time from the production to the use of the wafer cleaning water W can be shortened and the cleanliness can thus be ensured.

Second Embodiment

The second embodiment of the present invention will then be described.

<Wafer Cleaning Water Supply System>

Figure 2:
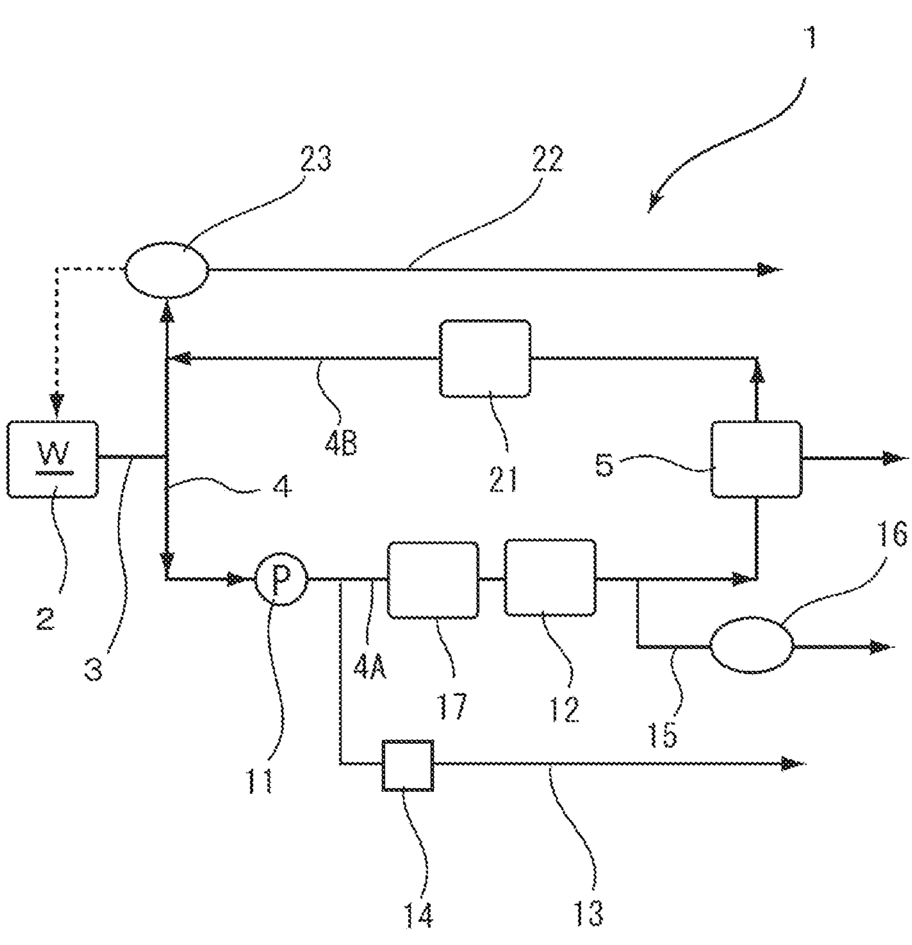
FIG. 2 is a schematic diagram illustrating a wafer cleaning water supply system according to a second embodiment of the present invention.

FIG. 2 illustrates a wafer cleaning water supply system according to the second embodiment of the present invention. The wafer cleaning water supply system 1 of the second embodiment has the same configuration as that of the previously described first embodiment except that a gas-dissolving membrane 17 is provided upstream the supply-side flowmeter 12, so the same configurations are denoted with the same reference numerals, and the detailed description will be omitted.

When dissolving a gas component such as hydrogen or carbon dioxide in the wafer cleaning water W, a configuration may be adopted as in the present embodiment in which the gas-dissolving membrane 17 is provided on the supply side 4A of the circulation-type cleaning water supply pipe 4 to dissolve a desired gas component in the cleaning water supply pipe 4.

Third Embodiment

The third embodiment of the present invention will be described.

<Wafer Cleaning Water Supply System>

Figure 3:
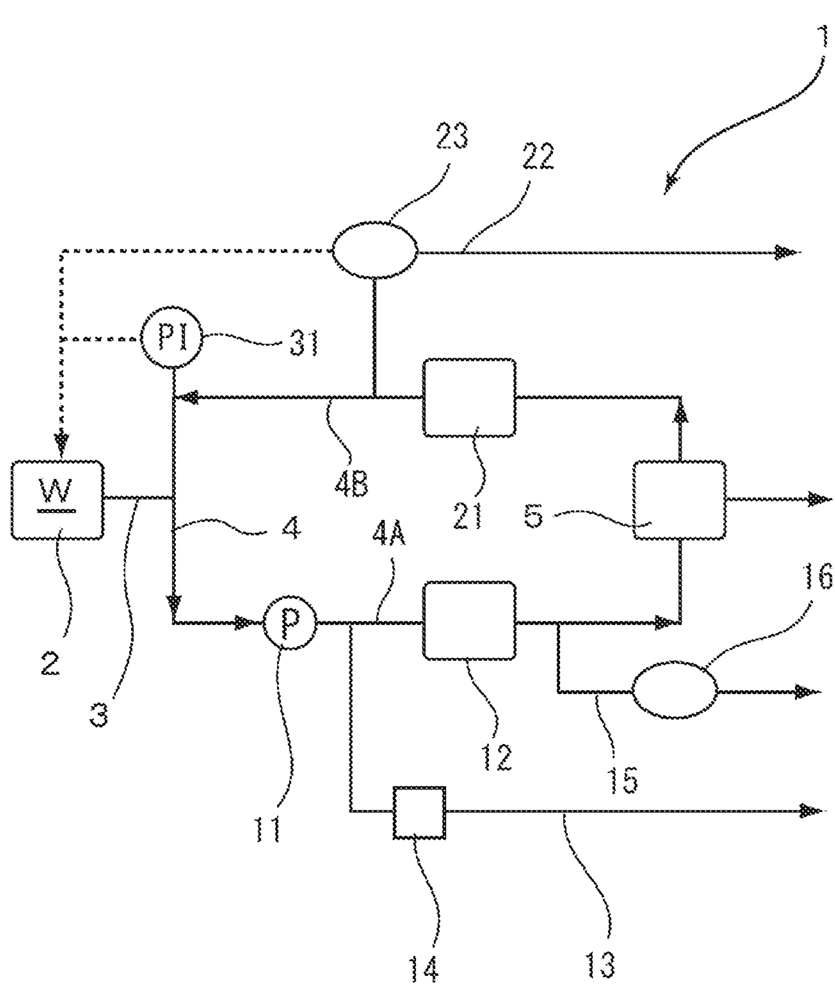
FIG. 3 is a schematic diagram illustrating a wafer cleaning water supply system according to a third embodiment of the present invention.

FIG. 3 illustrates a wafer cleaning water supply system according to the third embodiment of the present invention. The wafer cleaning water supply system of the third embodiment has the same configuration as that of the previously described first embodiment except that a pressure gauge 31 as a pressure measurement means is provided as substitute for the recovery-side flowmeter 21, so the same configurations are denoted with the same reference numerals, and the detailed description will be omitted.

In FIG. 3, the wafer cleaning water supply system 1 has a wafer cleaning water production unit 2 that dissolves a predetermined amount of a chemical agent in a flow volume of ultrapure water thereby to produce wafer cleaning water having a predetermined concentration of the chemical agent, a replenishment pipe 3 that extends from the wafer cleaning water production unit 2, and a circulation-type cleaning water supply pipe 4 that is connected to the replenishment pipe 3.

The circulation-type cleaning water supply pipe 4 can feed a cleaning liquid W to a use point 5 via a feeding pump 11, and two flow paths between the connection portion of the cleaning water supply pipe 4 to the replenishment pipe 3 and the use point 5 are a supply side 4A and a recovery side 4B. The supply side 4A is provided with a supply-side flowmeter 12, and a discharge pipe 13 and a sampling pipe for analysis 15 are connected to the supply side 4A. The discharge pipe 13 is provided with a relief valve (pressure regulating valve) 14. The sampling pipe for analysis 15 is provided with a first monitor 16 that cooperates with various water quality sensors (not illustrated). The recovery side 4B is provided with the pressure gauge 31 as the measurement means, and a sampling pipe for monitoring 22 is connected to the recovery side 4B. The sampling pipe for monitoring 22 is provided with a second monitor 23 that cooperates with various water quality sensors (not illustrated). The measurement result of the supply-side flowmeter 12, the measurement result of the pressure gauge 31, and the water quality data obtained by the first monitor 16 and the second monitor 23 with their various water quality sensors are transmitted to a control device (not illustrated), which can control the wafer cleaning water production unit 2.

<Method of Supplying Wafer Cleaning Water>

The description will then be directed to a method of supplying wafer cleaning water using the wafer cleaning water supply system 1 of the present embodiment having the configuration as described previously.

(Wafer Cleaning Water Supply Step)

The wafer cleaning water W produced by the wafer cleaning water production unit 2 flows into the circulation-type cleaning water supply pipe 4 via the supply pipe 3 and is supplied to the use point 5 by the feeding pump 11. At this time, the amount of the wafer cleaning water W supplied to the use point 5 is measured by the supply-side flowmeter 12, but when the use point 5 is composed of a plurality of cleaning machines, for example, the initial supply amount of the wafer cleaning water W may be set with reference to the maximum water amount so that the wafer cleaning water W will not run short at the use point 5. Then, the intratubular pressure on the supply side 4A can be calculated from the amount of the wafer cleaning water W supplied by the feeding pump 11 at that time and the inner diameter of the cleaning water supply tube 4.

The usage amount of the wafer cleaning water W at the use point 5 fluctuates greatly depending on the number of cleaning machines in operation or the like. The unused wafer cleaning water W therefore flows back from the recovery side 4B of the circulation-type cleaning water supply pipe 4 toward the supply pipe 3. At this time, the intratubular pressure of the wafer cleaning water W to be recovered through the cleaning water supply pipe 4 is measured by the pressure gauge 31. The water quality of the wafer cleaning water W on the recovery side is monitored by the second monitor 23 which cooperates with various water quality sensors (not illustrated) provided in the sampling pipe for monitoring 22, and the monitoring is thus performed on a difference from the set water quality.

Then, the measurement value of the supply-side flowmeter 12 and the intratubular pressure on the recovery side 4B measured by the pressure gauge 31 are transmitted to the control device. The control device calculates the intratubular pressure on the supply side 4A from the amount of the wafer cleaning water W supplied by the feeding pump 11 at that time and the inner diameter of the cleaning water supply tube 4, calculates the amount of water used from the difference between the calculated intratubular pressure on the supply side 4A and the intratubular pressure on the recovery side 4B measured by the pressure gauge 31, and controls the wafer cleaning water production unit 2 by feedback control to replenish the calculated usage amount of the wafer cleaning water W to the cleaning water supply pipe 4. When the amount of the wafer cleaning water W to be replenished becomes excessive and the pressure of the wafer cleaning water W in the cleaning water supply pipe 4 exceeds a predetermined value, the relief valve (pressure regulating valve) 14 is operated to discharge the excessive wafer cleaning water W, and the pressure of the wafer cleaning water W in the cleaning water supply pipe 4 can thereby be kept below a certain value. Furthermore, even when the wafer cleaning water W is not used at the use point 5, it is preferred to supply a small amount of the wafer cleaning water from the wafer cleaning water production unit 2 to the circulation-type cleaning water supply pipe so as not to stop the production of the wafer cleaning water W, thereby stabilizing the chemical agent concentration of the wafer cleaning water W.

The measurement values of the first monitor 16 and the second monitor 23 measured by various water quality sensors are also transmitted to the control device, which controls the water quality of the wafer cleaning water W produced as necessary by the wafer cleaning water production unit 2 based on the measurement value of the water quality of the recovered wafer cleaning water W.

Thus, in the present embodiment, by measuring the intratubular pressure on the recovery side 4B of the wafer cleaning water W circulating through the circulation-type cleaning water supply pipe 4, the usage amount of the wafer cleaning water W is calculated. Then, the wafer cleaning water production unit 2 produces and replenishes the wafer cleaning water W corresponding to that amount of water used, thus minimizing the excessive wafer cleaning water W, and the chemical agent component of the wafer cleaning water W can be controlled with a high degree of accuracy. Moreover, an effect can be obtained that since there is no need to provide a reservoir, not only the entire system 1 can be made compact, but also the wafer cleaning water W does not stay in a reservoir; therefore, the residence time from the production to the use of the wafer cleaning water W can be shortened and the cleanliness can thus be ensured.

Fourth Embodiment

The fourth embodiment of the present invention will then be described.

<Wafer Cleaning Water Supply System>

Figure 4:
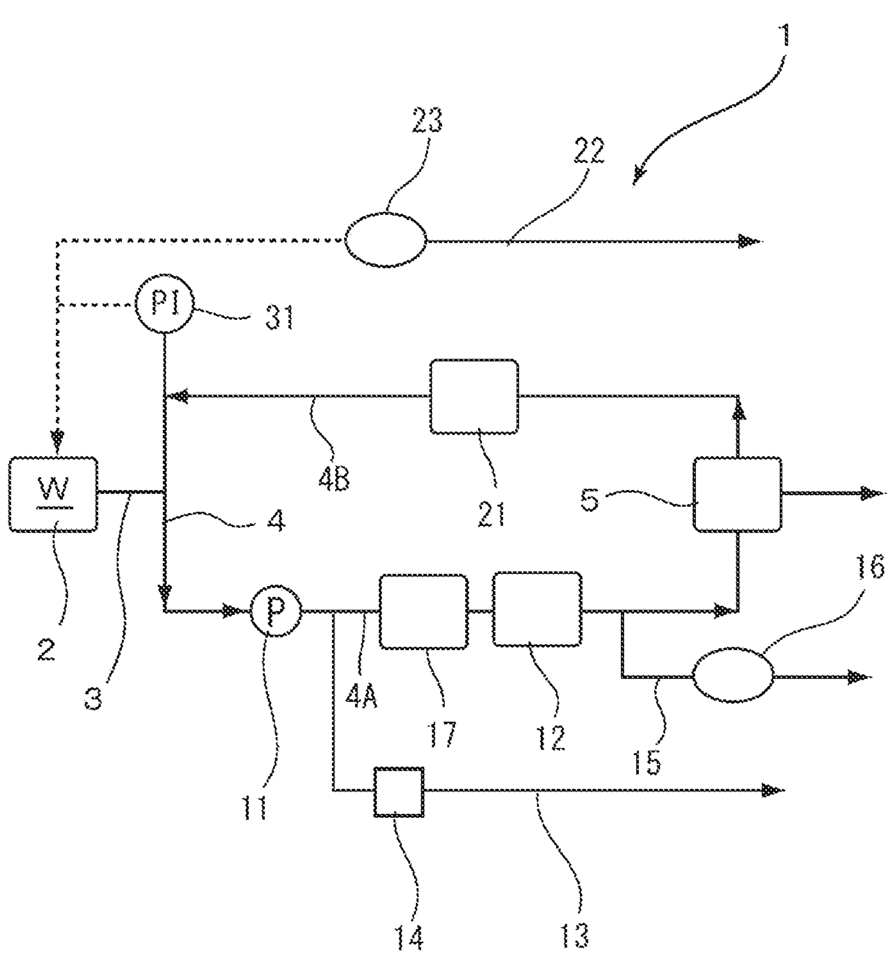
FIG. 4 is a schematic diagram illustrating a wafer cleaning water supply system according to a fourth embodiment of the present invention.

FIG. 4 illustrates a wafer cleaning water supply system according to the fourth embodiment of the present invention. The wafer cleaning water supply system 1 of the fourth embodiment has the same configuration as that of the previously described third embodiment except that a gas-dissolving membrane 17 is provided upstream the supply-side flowmeter 12, so the same configurations are denoted with the same reference numerals, and the detailed description will be omitted.

When dissolving a gas component such as hydrogen or carbon dioxide in the wafer cleaning water W, a configuration may be adopted as in the present embodiment in which the gas-dissolving membrane 17 is provided on the supply side 4A of the circulation-type cleaning water supply pipe 4 to dissolve a desired gas component in the cleaning water supply pipe 4.

According to the first to fourth embodiments of the present invention as described above, when the use point 5 is composed of 10 washing machines of 52 L/min per one machine, for example, the cleaning water W at a rate of 520 L/min is required for free-flowing, but it may be sufficient to circulate the wafer cleaning water W at a rate of about 100 to 250 L/min because the required amount of the wafer cleaning water W is actually 5 to 20 vol %. In addition, the usage amount of the wafer cleaning water W fluctuates from 5% to 10% by about 50 to 100 L/min, but in the present embodiment, the wafer cleaning water W can be further saved for the above circulation amount because the wafer cleaning water W is replenished in response to the fluctuating usage amount. Moreover, since the wafer cleaning water W is directly supplied from the wafer cleaning water production unit to the circulation-type cleaning water supply pipe 4 through the replenishment pipe 3, thereby eliminating the need to provide a reservoir, the wafer cleaning water supply system 1 can be made compact, and the cleaning water does not stay in a reservoir; therefore, the residence time from the production to the use of the wafer cleaning water W can be shortened, and the cleanliness can thus be ensured.

While the present invention has been heretofore described based on the above embodiments with reference to the accompanying drawings, the present invention is not limited to the above embodiments, and various modifications can be carried out. For example, the usage amount of the washing water W at the use point 5 or in the washing machines constituting the use point 5 may be directly measured. In the above embodiments, the flowmeter 21 and the pressure gauge 31 are used as the measurement means for measuring the recovery amount for the replenishment pipe 3, but a measurement means capable of measuring other items can also be applied, provided that the amount of water used can be calculated.

DESCRIPTION OF REFERENCE NUMERALS

1 Wafer cleaning water supply system
2 Wafer cleaning water production unit
3 Replenishment pipe
4 Circulation-type cleaning water supply pipe
4A Supply side
4B Recovery side
5 Use point
11 Feeding pump
12 Supply-side flowmeter (measurement means)
13 Discharge pipe
14 Relief valve
15 Sampling pipe for analysis
16 First monitor
17 Gas-dissolving membrane
21 Recovery-side flowmeter (measurement means)
22 Sampling pipe for monitoring
23 Second monitor
31 Pressure gauge (measurement means)
W Wafer cleaning water

The invention claimed is:

1. A wafer cleaning water supply system comprising:

a wafer cleaning water production unit that dissolves a chemical agent in ultrapure water thereby to produce wafer cleaning water having a predetermined concentration of the chemical agent;

a circulation-type cleaning water supply pipe that supplies the wafer cleaning water produced by the wafer cleaning water production unit to a use point;

a replenishment pipe that connects the wafer cleaning water production unit and the circulation-type cleaning water supply pipe;

a measurement means for calculating a usage amount of cleaning water at the use point of the wafer cleaning water that circulates through the circulation-type cleaning water supply pipe; and a control means that controls a replenishment amount of the wafer cleaning water from the wafer cleaning water production unit to the circulation-type cleaning water supply pipe based on a measurement result of the measurement means, wherein the circulation-type cleaning water supply pipe includes a supply side that supplies the wafer cleaning water to the use point and a recovery side that recovers unused wafer cleaning water from the use point, the supply side and the recovery side form a circulation path between a connection portion of the circulation-type cleaning water supply pipe to the replenishment pipe and the use point, and no reservoir is provided in the circulation path.

2. The wafer cleaning water supply system according to claim 1, wherein the measurement means is a flowmeter, the usage amount of the wafer cleaning water at the use point is calculated based on a measurement value of the flowmeter, and the replenishment amount of the wafer cleaning water is controlled by the control means.

3. The wafer cleaning water supply system according to claim 1, wherein the measurement means is a pressure gauge, the usage amount of the wafer cleaning water from the use point is calculated based on a measurement value of the pressure gauge, and the replenishment amount of the wafer cleaning water is controlled by the control means.

4. The wafer cleaning water supply system according to claim 1, wherein the use point has a plurality of cleaning machines.

5. The wafer cleaning water supply system according to claim 1, wherein the circulation-type cleaning water supply pipe has a relief valve.

6. The wafer cleaning water supply system according to claim 1, wherein the wafer cleaning water production unit is supplied with a liquid chemical agent component by a pump or by a pressurization means using an inert gas to supply the liquid chemical agent component from a tank that stores the liquid chemical agent component.

7. A method of supplying wafer cleaning water, the method comprising:

dissolving a chemical agent in ultrapure water in a wafer cleaning water production unit thereby to produce wafer cleaning water having a predetermined concentration of the chemical agent;

feeding the wafer cleaning water, by a replenishment pipe connected to the wafer cleaning water production unit and a circulation-type cleaning water supply pipe, to the circulation-type cleaning water supply pipe thereby to supply the wafer cleaning water to a use point; and circulating, by the circulation-type cleaning water supply pipe, the wafer cleaning water unused at the use point and reusing the unused wafer cleaning water, wherein the circulation-type cleaning water supply pipe includes a supply side that supplies the wafer cleaning water to the use point and a recovery side that recovers the unused wafer cleaning water from the use point;

the supply side and the recovery side form a circulation path between a connection portion of the circulation-type cleaning water supply pipe to the replenishment pipe and the use point;

no reservoir is provided in the circulation path, an index for calculating a usage amount of cleaning water is measured at the use point of the wafer cleaning water that circulates through the circulation-type cleaning water supply pipe; and a replenishment amount of the wafer cleaning water based on the measurement result is controlled by a control means.

8. The method according to claim 7, wherein the wafer cleaning water is not supplied to the circulation-type cleaning water supply pipe until a chemical agent component of the wafer cleaning water reaches a predetermined concentration.

9. The method according to claim 7, wherein a small amount of cleaning water is supplied to the circulation-type cleaning water supply pipe even when the wafer cleaning water is not used at the use point.

* * * * *